(12) United States Patent
Kinjo

(10) Patent No.: US 12,376,493 B2
(45) Date of Patent: Jul. 29, 2025

(54) DETECTING DEVICE

(71) Applicant: Japan Display Inc., Tokyo (JP)

(72) Inventor: Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/795,498

(22) Filed: Aug. 6, 2024

(65) Prior Publication Data

US 2024/0397827 A1 Nov. 28, 2024

Related U.S. Application Data

(63) Continuation of application No. PCT/JP2023/003025, filed on Jan. 31, 2023.

(30) Foreign Application Priority Data

Feb. 9, 2022 (JP) .................. 2022-018689

(51) Int. Cl.
| | |
|---|---|
| *G06F 3/043* | (2006.01) |
| *H10N 30/00* | (2023.01) |
| *H10N 30/87* | (2023.01) |

(52) U.S. Cl.
CPC ......... *H10N 30/101* (2024.05); *H10N 30/872* (2023.02); *G06F 3/043* (2013.01)

(58) Field of Classification Search
CPC ..... H10N 30/101; H10N 30/872; G06F 3/043
See application file for complete search history.

(56) References Cited

U.S. PATENT DOCUMENTS

| | | | |
|---|---|---|---|
| 2015/0165479 A1* | 6/2015 | Lasiter | B06B 1/0666 29/25.35 |
| 2015/0169136 A1 | 6/2015 | Ganti et al. | |
| 2023/0017034 A1* | 1/2023 | Miao | B81C 1/00158 |

FOREIGN PATENT DOCUMENTS

WO 2015089453 A1 6/2015

* cited by examiner

*Primary Examiner* — Robert J Michaud
(74) *Attorney, Agent, or Firm* — Maier & Maier, PLLC

(57) ABSTRACT

A detecting device includes a plurality of ultrasonic transducers that transmit and receive ultrasonic waves. The detecting device includes a laminate, and a frame layer stacked on at least one face of a first face of the laminate and a second face opposite the first face. The laminate includes a flexible substrate, a circuit layer including a plurality of first electrodes and at least one second electrode, the circuit layer being stacked on the flexible substrate, and a piezoelectric layer stacked on the circuit layer. One of the ultrasonic transducers includes at least one of the first electrodes that is in contact with the piezoelectric layer, and at least one of the second electrodes that is in contact with the piezoelectric layer, and the frame layer has a cavity at a position that overlaps the first electrode in plan view.

17 Claims, 16 Drawing Sheets

DETECTING DEVICE

CROSS-REFERENCE TO RELATED APPLICATION

This application is a continuation of International Patent Application No. PCT/JP2023/003025 filed on Jan. 31, 2023 which designates the United States, incorporated herein by reference, and which claims the benefit of priority from Japanese Patent Application No. 2022-018689 filed on Feb. 9, 2022, incorporated herein by reference.

BACKGROUND

1. Technical Field

The present disclosure relates to an ultrasonic transducer using ultrasonic waves and a detecting device using the ultrasonic transducer.

2. Description of the Related Art

Ultrasonic transducers have been known (see, for example, WO 2015/089453 and the description of U.S. Unexamined Patent Application Publication No. 2015/0165479).

Ultrasonic transducers require a cavity in contact with a piezoelectric layer to be formed in an anchor structure or on a substrate made of glass or silicon, for example. A cavity provided in the anchor structure causes a laminated surface where the piezoelectric layer and the anchor structure are bonded to vibrate, which may result in insufficient strength. Producing cavities by backside etching of the backside of the substrate can be costly.

It is an object of the present disclosure to provide a detecting device having a low-cost, highly reliable ultrasonic transducer.

SUMMARY

A detecting device according to an embodiment of the present disclosure includes a plurality of ultrasonic transducers that transmit and receive ultrasonic waves. The detecting device includes a laminate, and a frame layer stacked on at least one face of a first face of the laminate and a second face opposite the first face. The laminate includes a flexible substrate, a circuit layer including a plurality of first electrodes and at least one second electrode, the circuit layer being stacked on the flexible substrate, and a piezoelectric layer stacked on the circuit layer. One of the ultrasonic transducers includes at least one of the first electrodes that is in contact with the piezoelectric layer, and at least one of the second electrodes that is in contact with the piezoelectric layer, and the frame layer has a cavity at a position that overlaps the first electrode in plan view.

DETAILED DESCRIPTION

Embodiments of the present disclosure will be described in detail with reference to the drawings. The present disclosure is not limited by what is described in the following embodiments. Components described below include those that can be readily assumed by a person skilled in the art and those that are substantially the same. Furthermore, the components described below can be combined as appropriate. What is disclosed herein is merely an example, and any appropriate modification that could be easily conceived of by a person skilled in the art, while maintaining the purport of the invention, is naturally included within the scope of the present disclosure. The drawings may schematically illustrate the width, thickness, shape, and the like of each part compared to the actual mode for the sake of clarity of explanation, but this is merely an example and does not limit the interpretation of the present disclosure. In the present specification and figures, elements similar to those described previously with respect to the figures already mentioned are given the same reference signs, and the detailed description thereof may be omitted as appropriate.

First Embodiment

Figure 1:
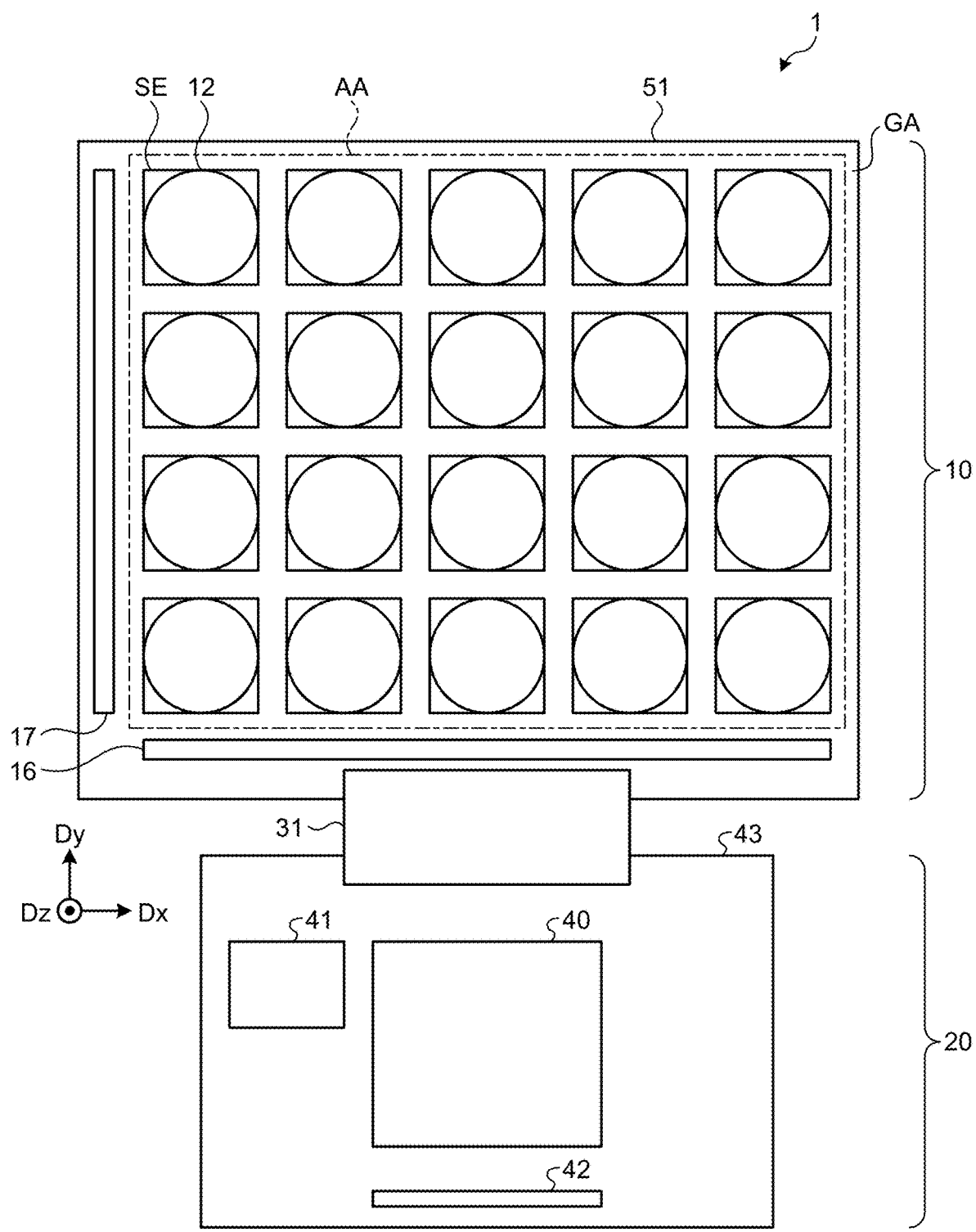
FIG. 1 is a plan view illustrating a schematic configuration of a detecting device including an ultrasonic element according to a first embodiment.

FIG. 1 is a plan view illustrating a schematic configuration of a detecting device including an ultrasonic element according to a first embodiment. As illustrated in FIG. 1, a detecting device 1 includes an ultrasonic transducer array 10 and a controller 20.

The ultrasonic transducer array 10 has a flexible substrate 51 and a plurality of ultrasonic transducers SE provided in a detection area AA of the flexible substrate 51. In the first embodiment, one first electrode 12 is disposed for one ultrasonic transducer SE. The flexible substrate 51 has a frame area GA outside the detection area AA. A signal line selection circuit 16 and a scanning circuit 17 are disposed in the frame area GA. The controller 20 has a control substrate 43, an ultrasonic processing circuit 40, a power supply circuit 41, and an interface circuit 42 mounted on the control substrate 43.

The control substrate 43 is electrically coupled to the flexible substrate 51 through a wiring substrate 31. The wiring substrate 31 is, for example, a flexible printed circuit board. The control substrate 43 is, for example, a rigid board.

The power supply circuit 41 supplies power to the interface circuit 42 and the ultrasonic processing circuit 40 on the basis of power supplied externally. The power supply circuit 41 supplies necessary power to the signal line selection circuit 16, the scanning circuit 17, the ultrasonic processing circuit 40, and the ultrasonic transducer SE through the wiring substrate 31 on the basis of the power supplied externally. The power supply circuit 41 is a circuit that manages power necessary for the signal line selection circuit 16, the scanning circuit 17, the ultrasonic transducer SE, the interface circuit 42, and the ultrasonic processing circuit 40.

The interface circuit 42 is, for example, a USB controller IC, and controls communication between an A/D conversion circuit 23 and a host controller (not illustrated) of a host device on which a detection system is mounted. The externally supplied power is supplied to the power supply circuit 41 through the interface circuit 42.

The detection area AA of the flexible substrate 51 is an area where the ultrasonic transducers SE arranged in a matrix (row-column configuration) in a Dx direction (first direction) and a Dy direction (second direction) are provided. The flexible substrate 51 is, for example, a flexible printed circuit (FPC).

In the present disclosure, the Dx direction (first direction) and the Dy direction (second direction) intersect and are orthogonal to each other. In the present disclosure, a direction orthogonal to the Dx direction (first direction) and the Dy direction (second direction) is a Dz direction (third direction).

As illustrated in FIG. 1, five ultrasonic transducers SE are arranged in the Dx direction and four ultrasonic transducers SE in the Dy direction, resulting in 5×4 (=20) ultrasonic transducers SE provided in the detection area AA of the flexible substrate 51. The ultrasonic transducers SE are the ultrasonic transducer array. The ultrasonic transducers SE may be arranged in a staggered arrangement. The number of the ultrasonic transducers SE provided in the detection area AA of the flexible substrate 51 is not limited to that of the embodiment.

Figure 2:
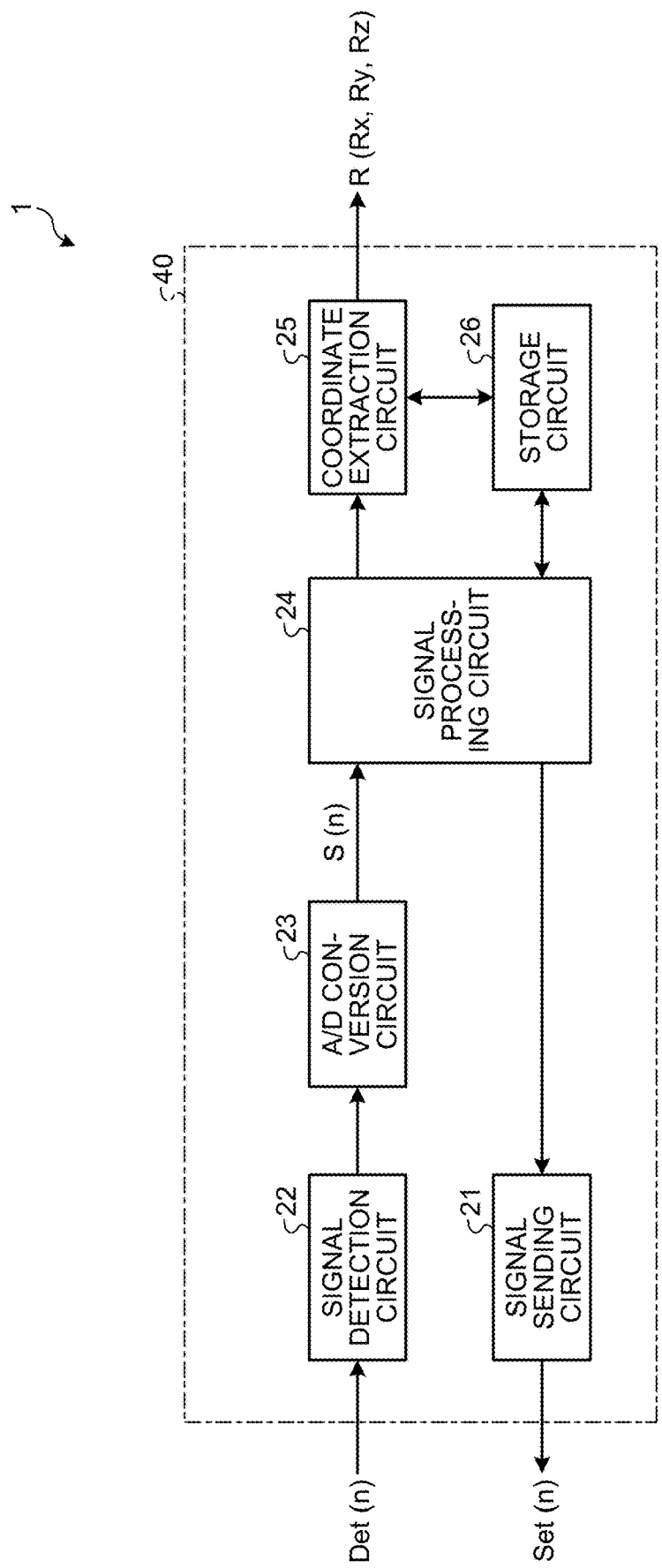
FIG. 2 is a block diagram illustrating an example of the configuration of the detecting device according to the first embodiment.

FIG. 2 is a block diagram illustrating an example of the configuration of the detecting device according to the first embodiment. As illustrated in FIG. 2, the ultrasonic processing circuit 40 includes a signal sending circuit 21, a signal detection circuit 22, the A/D conversion circuit 23, a signal processing circuit 24, a coordinate extraction circuit 25, and a storage circuit 26. The ultrasonic processing circuit 40 is, for example, a programmable logic device (PLD), such as a field programmable gate array (FPGA).

The signal sending circuit 21 sends oscillation pulses Set (n) (n is a natural number from 1 to N, where N is the number of electrodes in the detection area AA) to the first electrodes 12 (see FIG. 1) of the ultrasonic transducers SE on the basis of signals from the signal processing circuit 24.

The signal detection circuit 22 is, for example, an analog front end (AFE) IC. The signal detection circuit 22 generates a detection value S(n) of each first electrode 12 on the basis of a detection signal Det(n) (n is a natural number from 1 to N, where N is the number assigned to the electrodes in the detection area AA, and the maximum value is the number of electrodes) output from the ultrasonic transducer array 10. The A/D conversion circuit 23 samples and converts the detection value S(n) of each first electrode 12 into a digital signal.

The signal processing circuit 24 performs predetermined signal processing on the detection value S(n) from the A/D conversion circuit 23. Specifically, the signal processing circuit 24 performs a comparison computation of the detection value S(n).

The coordinate extraction circuit 25 extracts space coordinates of the position where an object to be detected is present, on the basis of the results of the comparison computation of the signal processing circuit 24. The coordinate extraction circuit 25 extracts space coordinates R (Rx, Ry, Rz) indicating the position of an object to be detected F in the space on the detection area AA illustrated in FIG. 4 by using the detection value S(n) of each first electrode 12 processed by the signal processing circuit 24. Information on the space coordinates R (Rx, Ry, Rz) is output to an external device through the interface circuit 42 (see FIG. 1).

The storage circuit 26 has the function of storing the information on the space coordinates R (Rx, Ry, Rz) extracted in the coordinate extraction circuit 25.

Figure 3:
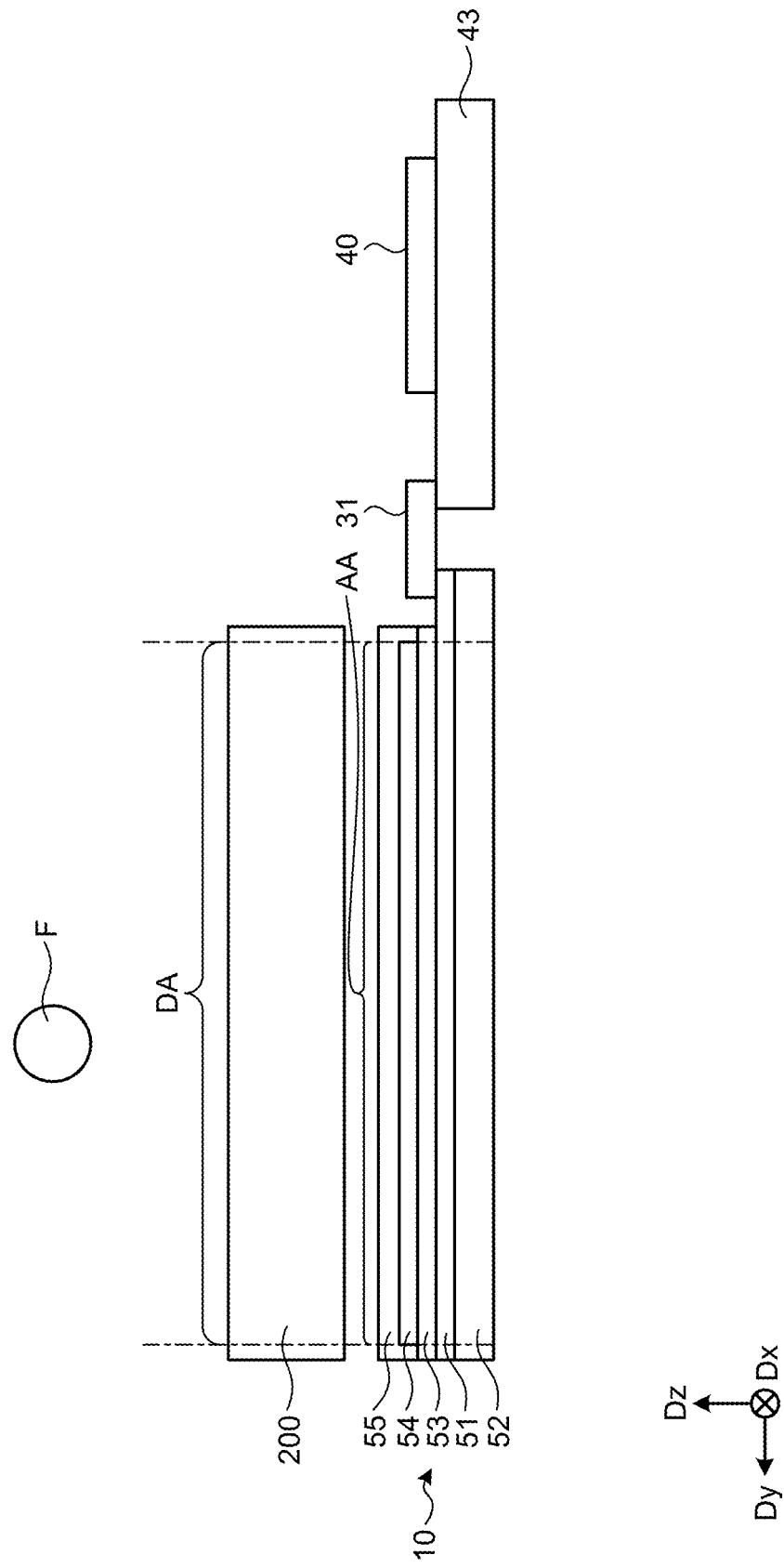
FIG. 3 is a schematic diagram illustrating a schematic sectional configuration of the detecting device according to the first embodiment.

FIG. 3 is a schematic diagram illustrating a schematic sectional configuration of the detecting device according to the first embodiment. The detecting device 1 of the first embodiment is disposed so as to face a display panel 200. The detection area AA (see FIG. 1) of the ultrasonic transducer array 10 and a display area DA of the display panel 200 are arranged so as to overlap in the Dz direction (third direction) in plan view. In the illustrated example, the detection area AA of the ultrasonic transducer array 10 and the display area DA of the display panel 200 are disposed so as to overlap one another as a whole. The ultrasonic transducer array 10, however, may be disposed so as to overlap only a portion of the display panel 200.

The display panel 200 is exemplified by a liquid crystal display (LCD). The display panel 200 may be, for example, an organic light emitting diode (OLED) or inorganic EL display (micro LED, mini LED).

In the first embodiment, the ultrasonic transducer array 10 includes the flexible substrate 51, a frame layer 52, a circuit layer 53, a piezoelectric layer 54, and a protective layer 55. The ultrasonic transducer array 10 is stacked in the following order from the opposite side of the display panel 200: the frame layer 52, the flexible substrate 51, the circuit layer 53, the piezoelectric layer 54, and the protective layer 55.

Figure 4:
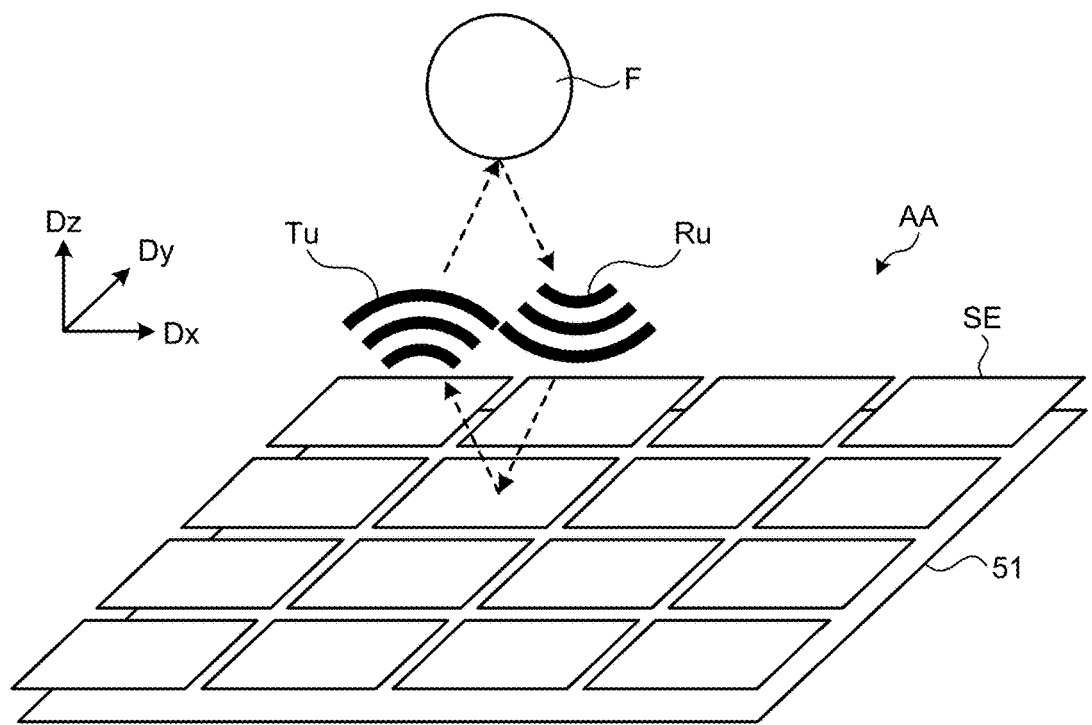
FIG. 4 is a schematic diagram illustrating a relation between an object to be detected and the detecting device in a space on a detection area.

FIG. 4 is a schematic diagram illustrating a relation between the object to be detected and the detecting device in the space on the detection area. The ultrasonic transducer SE converts an oscillation pulse Set (n) to generate ultrasonic waves Tu, which are then sent. The ultrasonic transducer SE receives ultrasonic waves Ru reflected from the object to be detected F (e.g., an operator's finger), and converts it into the detection signal Det(n). The coordinate extraction circuit 25 (see FIG. 2) generates space coordinates indicating the position where the object to be detected F (e.g., the operator's finger) is present on the detection area AA, on the basis of the detection value S(n) generated from the detection signal Det(n). The ultrasonic transducer SE can also measure the distance to the object to be detected F (e.g., the operator's finger) on the basis of the time it takes to receive the ultrasonic waves Ru reflected from the object to be detected F (e.g., the operator's finger).

Figure 5:
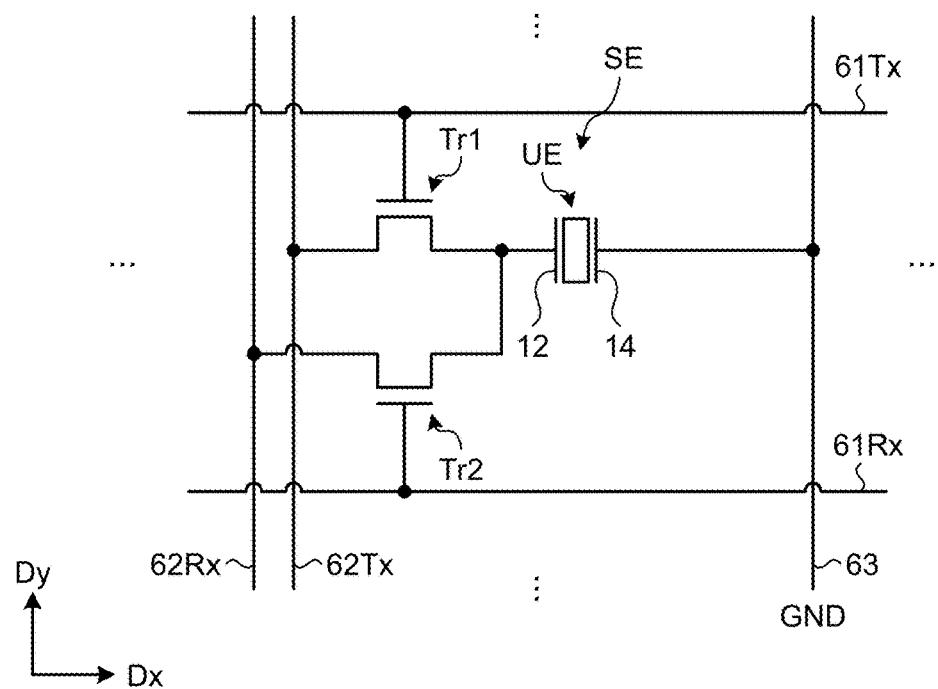
FIG. 5 is a circuit diagram illustrating one of a plurality of detection areas according to the first embodiment.
Figure 6:
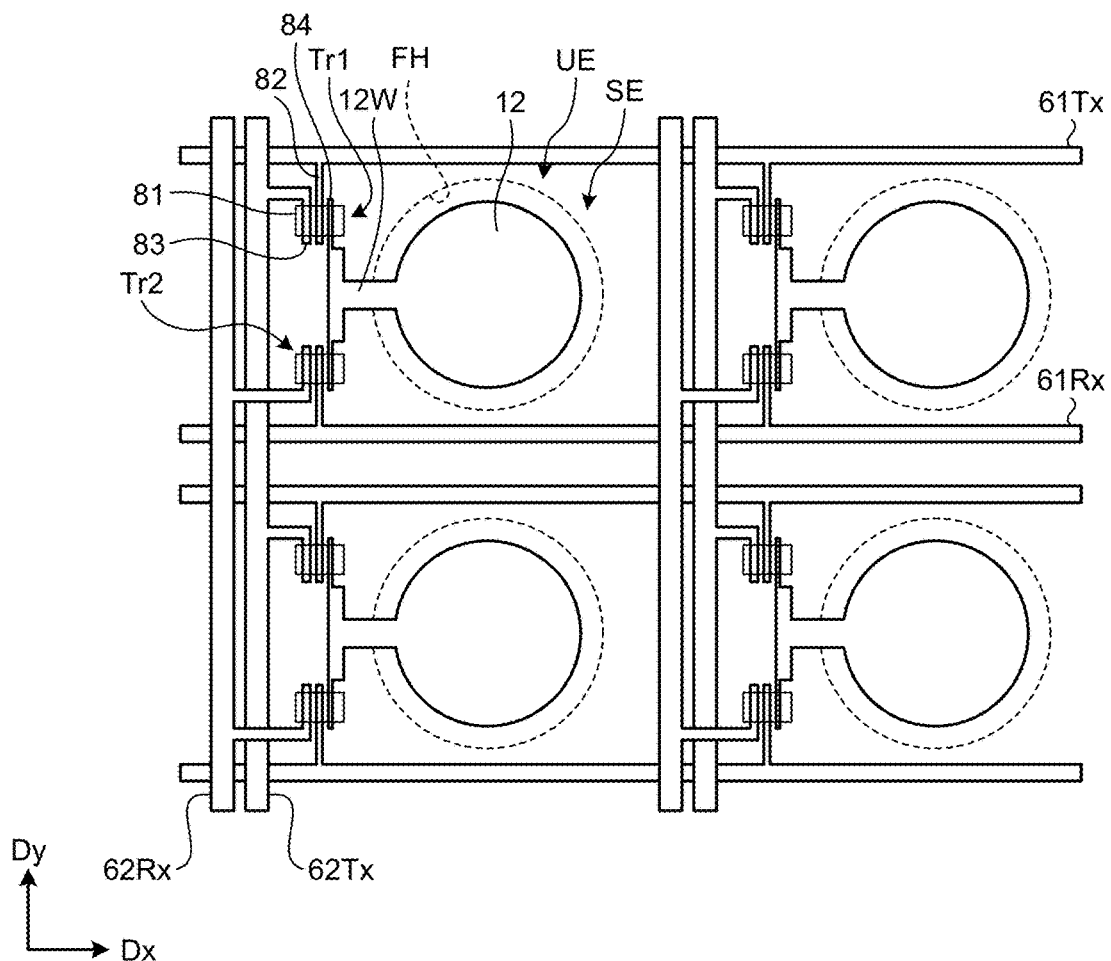
FIG. 6 is a plan view illustrating the detection area according to the first embodiment.

FIG. 5 is a circuit diagram illustrating one of a plurality of detection areas according to the first embodiment. FIG. 6 is a plan view illustrating the detection area according to the first embodiment.

The scanning circuit 17 illustrated in FIG. 1 is a circuit that drives a plurality of scanning lines 61Tx and 61Rx illustrated in FIGS. 5 and 6 on the basis of various control signals. The scanning circuit 17 serves as both a drive circuit that scans the scanning lines 61Tx of the ultrasound transducers SE and a drive circuit that scans the scanning lines 61Rx of the ultrasound transducers SE. The scanning circuit 17 sequentially selects the scanning lines 61Tx and the scanning lines 61Rx, and supplies gate drive signals to the selected scanning lines 61Tx and the scanning lines 61Rx. With this operation, the scanning circuit 17 selects the ultrasound transducers SE coupled to the scanning lines 61Tx and the scanning lines 61Rx. The scanning lines 61Tx and the scanning lines 61Rx are made of metallic materials, such as aluminum (Al), gold, molybdenum, and titanium.

The signal line selection circuit 16 is a switch circuit that sequentially or simultaneously selects a plurality of transmission signal lines 62Tx and a plurality of reception signal lines 62Rx. The signal line selection circuit 16 is, for example, a multiplexer. The signal line selection circuit 16 couples the selected transmission signal lines 62Tx to the signal sending circuit 21 on the basis of selection signals supplied from the ultrasonic processing circuit 40. The signal line selection circuit 16 couples the selected reception signal lines 62Rx to the signal detection circuit 22 on the basis of selection signals supplied from the ultrasonic processing circuit 40. With this operation, the signal line selection circuit 16 outputs the detection signal Det(n) of the ultrasonic transducer SE to the signal detection circuit 22. The transmission signal lines 62Tx and the reception signal lines 62Rx are made of metallic materials, such as aluminum (Al), gold, molybdenum, and titanium.

The ultrasonic transducers SE each includes a first switching element Tr1, a second switching element Tr2, and a membrane vibrator UE. The first switching element Tr1 performs switching control of coupling between the transmission signal line 62Tx and the membrane vibrator UE. The second switching element Tr2 performs switching control of coupling between the reception signal line 62Rx and the membrane vibrator UE.

The first electrode 12 on one end of the membrane vibrator UE is coupled to a drain of the first switching element Tr1 and a drain of the second switching element Tr2, and the second electrode 14 on the other end of the membrane vibrator UE is coupled to a reference potential wiring line 63 to which a reference potential GND is supplied. As illustrated in FIG. 6, the first electrode 12 is coupled to the drain of the first switching element Tr1 and the drain of the second switching element Tr2 through the coupling wiring 12W. The transmission signal line 62Tx is coupled to a source of the first switching element Tr1. The reception signal line 62Rx is coupled to a source of the second switching element Tr2. The scanning line 61Tx is coupled to a gate of the first switching element Tr1. The scanning line 61Rx is coupled to a gate of the second switching element Tr2. The coupling to the drains of the first switching element Tr1 and the second switching element Tr2 and the coupling to the sources of the first switching element Tr1 and the second switching element Tr2 may be interchanged with each other. The reference potential wiring line 63 is made of a metallic material, such as aluminum (Al), gold, molybdenum, and titanium.

Examples of the circuits illustrated in FIGS. 5 and 6 may further include, but not limited to, other transistors, signal amplification circuits, band-pass filters, capacitance, etc.

Figure 7:
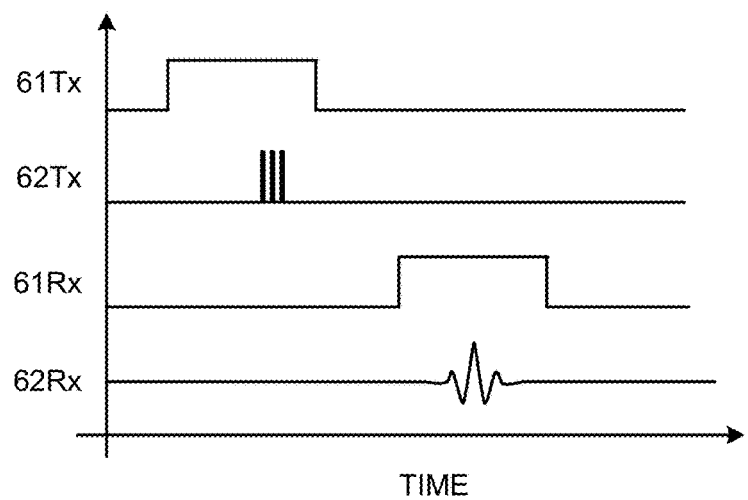
FIG. 7 is a timing chart illustrating the operation of one ultrasonic transducer in the first embodiment.

FIG. 7 is a timing chart illustrating the operation of one ultrasonic transducer in the first embodiment. As illustrated in FIG. 7, transmission and reception of ultrasonic waves are processed in a time-division manner. In the transmission of ultrasonic waves, a gate drive signal is transmitted to the scanning line 61Tx selected by the scanning circuit 17, and the signal line selection circuit 16 transmits an oscillation pulse Set (n) from the signal sending circuit 21 to the selected transmission signal line 62Tx. The membrane vibrator UE vibrates based on the oscillation pulse Set (n) to generate ultrasonic waves Tu. The frequency of the ultrasonic waves Tu is, for example, 1 kHz to 1 MHz.

Next, a gate drive signal is transmitted to the scanning line 61Rx selected by the scanning circuit 17, and the signal line selection circuit 16 couples the selected reception signal line 62Rx to the signal detection circuit 22. Upon receiving the ultrasonic waves Ru, the membrane vibrator UE converts the ultrasonic waves Ru into a detection signal Det(n) of an electrical signal, and the detection signal Det(n) is transmitted to the signal detection circuit 22. In the illustrated example, the timing at which the gate drive signal is transmitted to the scanning line 61Tx does not coincide with the timing at which the gate drive signal is transmitted to the scanning line 61Rx. However, the timing at which the gate drive signals are transmitted to the scanning line 61Tx and the scanning line 61Rx may be simultaneous. Making the timing simultaneous incurs the risk of entanglement of the oscillation pulse Set (n) and the detection signal Det(n), but enables detection of a closer object.

Figure 8:
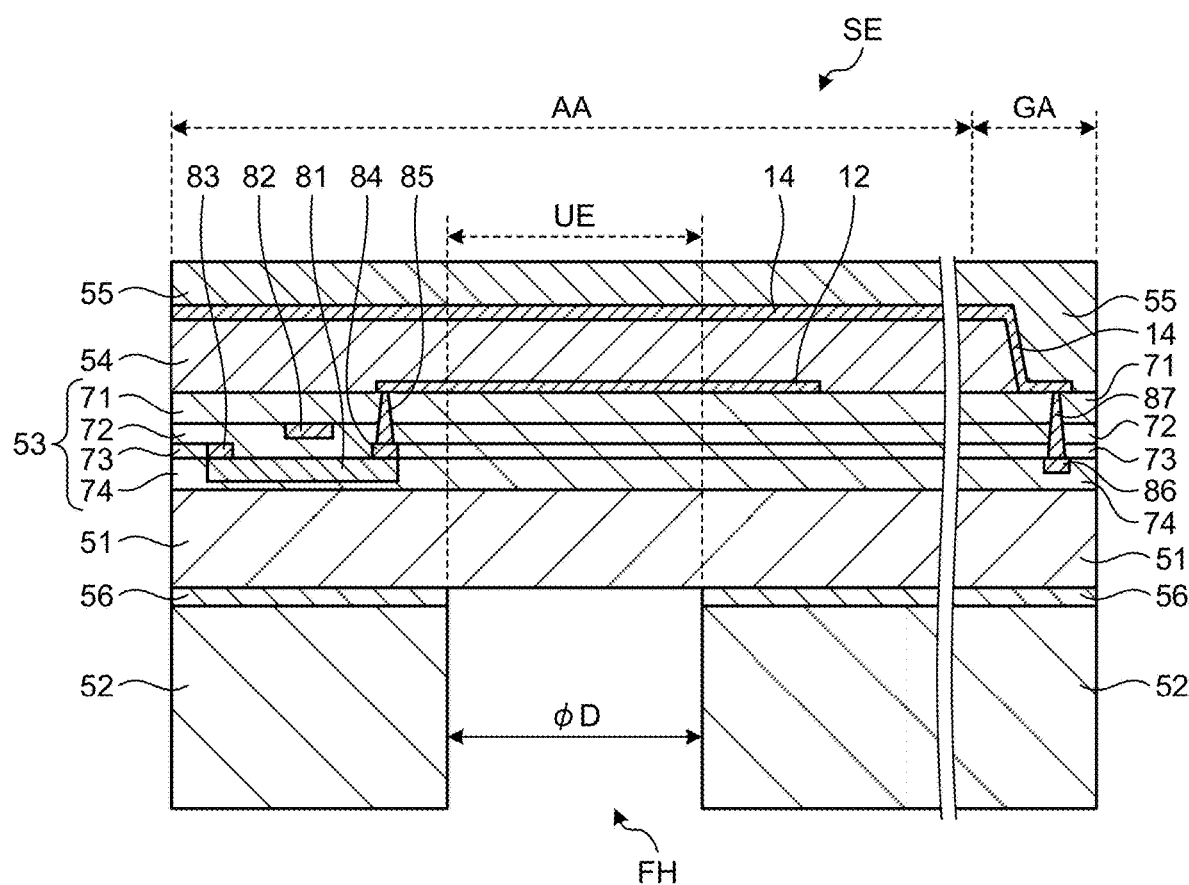
FIG. 8 is a sectional view of the detection area and a frame area according to the first embodiment.

FIG. 8 is a sectional view of the detection area and a frame area according to the first embodiment. The flexible substrate 51, the cross section of one ultrasonic transducer SE in the detection area AA of which is illustrated in FIG. 8 along with the cross section of the frame area GA, is a flexible resin substrate, and is made of a polyimide resin, for example. The thickness of the flexible substrate 51 is 1 μm to 100 μm.

A cavity FH is opened in the frame layer 52 for each ultrasonic transducer SE. The area overlapping the cavity FH in plan view is the membrane vibrator UE. As illustrated in FIG. 6, the cavity FH surrounds the first electrode 12 in plan view.

The frame layer 52 is, for example, a polyimide resin or metal foil. The thickness of the frame layer 52 is 1 μm to 100 μm. The frame layer 52 is more difficult to bend than the flexible substrate 51. For example, when the material of the frame layer 52 is the same as that of the flexible substrate 51, the frame layer 52 being thicker than the flexible substrate 51 causes the first electrode 12 and the flexible substrate 51 that overlaps the cavity FH in plan view to vibrate together and function as the membrane vibrator UE. When the material of the frame layer 52 differs from that of the flexible substrate 51, the Young's modulus and thickness of the frame layer 52 is set to be less bendable than the flexible substrate 51.

The cavity FH is circular in diameter φD. Thus, the membrane vibrator UE is also circular. The diameter φD is smaller than the region surrounded by the scanning line 61Tx, the scanning line 61Rx, the transmission signal line 62Tx, and the reception signal line 62Rx illustrated in FIG. 6. The diameter φD is, for example, 0.1 mm to 5 mm.

The piezoelectric layer 54 is formed of an inorganic material, such as lead zirconate titanate (PZT) and aluminum nitride (AlN), and an organic material, such as a polyvinylidene fluoride resin (polyvinylidene difluoride resin). The thickness of the piezoelectric layer 54 is, for example, 10 nm to 10000 nm. Examples of the piezoelectric layer 54 may include, but are not limited to, a buffer layer, a crystal adjustment layer, a protective layer, a matching layer, backing layer, etc., as needed. The piezoelectric layer 54 is formed over the entire detection area AA.

The area where the piezoelectric layer 54 is formed may be the same size as the area of the cavity FH in plan view, and may be provided overlapping the area of the cavity FH in plan view. The piezoelectric layer 54 may have a similar figure to the area of the cavity FH in plan view and larger than the boundary of the area of the cavity FH. Alternatively, the piezoelectric layer 54 may have a similar figure to the area of the cavity FH in plan view, smaller than the area of the cavity FH, and larger than the first electrode 12.

The circuit layer 53 and the piezoelectric layer 54 are formed on a glass substrate, and the circuit layer 53 and the piezoelectric layer 54 are transferred from the glass substrate to the flexible substrate 51. The piezoelectric layer 54 is formed on the glass substrate. The first electrode 12 is formed on the piezoelectric layer 54. A first resin layer 71 is formed on the first electrode 12. The first electrode 12 is made of a metallic material, such as aluminum (Al), gold, molybdenum, and titanium, for example. Alternatively, the first electrode 12 may be made of an alloy material containing at least one of these metallic materials, or a laminate of at least two of these metallic materials.

A gate electrode 82 is formed on the first resin layer 71 as viewed from the glass substrate. A second resin layer 72 is stacked on the gate electrode 82. A source electrode 83 and a drain electrode 84 are formed on the second resin layer 72. The drain electrode 84 is electrically coupled to the first electrode 12 through a through hole 85. The top of the second resin layer 72 around the source electrode 83 and the drain electrode 84 is covered with a third resin layer 73. A semiconductor layer 81 is formed on the source electrode 83 and the drain electrode 84, and the semiconductor layer 81 is bonded to both the source electrode 83 and the drain electrode 84. The semiconductor layer 81, the gate electrode 82, the source electrode 83, and the drain electrode 84 function as the first switching element Tr1. The gate electrode 82, the source electrode 83, the drain electrode 84, and the through hole 85 are made of metallic materials, such as aluminum (Al), gold, molybdenum, and titanium, for example. Alternatively, the gate electrode 82, the source electrode 83, the drain electrode 84, and the through hole 85 may be made of alloy materials containing at least one of these metallic materials, or laminates of at least two of these metallic materials. Because the second switching element Tr2 has the same configuration as the first switching element Tr1, a detailed description thereof is omitted.

The semiconductor layer 81 is an oxide semiconductor. More preferably, the semiconductor layer 81 is a transparent amorphous oxide semiconductor (TAOS) of oxide semiconductors. The use of an oxide semiconductor for the semiconductor layer 81 suppresses leakage current. In other words, the leakage current from the first switching element Tr1 or an unselected transistor of the second switching element Tr2 can be reduced. Thus, the detecting device 1 can improve the signal-to-noise (S/N) ratio. However, the semiconductor layer 81 is not limited thereto, and may be a microcrystalline oxide semiconductor, amorphous oxide semiconductor, polysilicon, low temperature polycrystalline silicone (LTPS), etc.

A fourth resin layer 74 is formed on the semiconductor layer 81 and the third resin layer 73. Because the circuit layer 53 is transferred from the glass substrate to the flexible substrate 51, the stacking order is reversed when viewed from the flexible substrate 51.

The second resin layer 72 is an inorganic insulating film such as silicon nitride. The first resin layer 71, the third resin layer 73, and the fourth resin layer 74 may be inorganic or organic insulating films, for example, an organic insulating film such as an acrylic resin. When the first resin layer 71, the third resin layer 73, and the fourth resin layer 74 are organic insulating films, cracks are less likely to occur in the circuit layer 53. The circuit layer 53 may partially vary in thickness. For example, the thickness of at least one of the first resin layer 71, the third resin layer 73, and the fourth resin layer 74 may be reduced or removed in the area of the cavity FH that overlaps in plan view.

The second electrode 14 is formed on a second face of the piezoelectric layer 54 opposite a first face on which the first electrode 12 is formed. The second electrode 14, also referred to as a counter electrode, is coupled to the reference potential wiring line 63 in the frame area GA through a through hole 87. The second electrode 14 is made of a metallic material, such as aluminum (Al), gold, molybdenum, and titanium, for example. Alternatively, the second electrode 14 may be made of an alloy material containing at least one of these metallic materials, or a laminate of at least two of these metallic materials.

The second electrode 14 is covered with the protective layer 55 of an organic insulating film such as an acrylic resin. The second electrode 14 is in contact with the face of the piezoelectric layer 54 opposite the face with which the first electrode 12 is in contact, and the piezoelectric layer 54 is sandwiched between the first electrode 12 and the second electrode 14. The second electrode 14 is provided across the ultrasonic transducers SE and is common to the ultrasonic transducers SE. With this configuration, the electrical resistance of the second electrode 14 is reduced.

The flexible substrate 51 and the frame layer 52 are bonded to each other through an adhesive layer 56. The adhesive layer 56 is adhesive on both sides, and the cavity FH is opened by pressing or other means with the adhesive layer 56 bonded to the frame layer 52.

In the example illustrated in FIG. 8, the ultrasonic transducer SE is formed by transfer, but may be formed by other methods. For example, the flexible substrate 51 is formed on a glass substrate, on which the circuit layer 53 is formed and above which the piezoelectric layer 54, the second electrode 14, and the protective layer 55 are formed. The flexible substrate 51 may then be peeled off from the glass substrate, and the flexible substrate 51 and the frame layer 52 may be bonded to each other. In this case, the circuit layer 53, the piezoelectric layer 54, the second electrode 14, and the protective layer 55 are sequentially stacked and formed, so that the stacking order is not reversed when viewed from the flexible substrate 51.

The first switching element Tr1 is provided at a position that does not overlap the cavity FH in plan view, and the first switching element Tr1 and the first electrode 12 are electrically coupled to each other at a position that does not overlap the cavity FH in plan view. Thus, vibration of the membrane vibrator UE suppresses the possibility of deterioration of the first switching element Tr1 and decoupling of the first electrode 12 from the first switching element Tr1.

The frame layer 52 may be formed by covering the area of the cavity FH with a photoresist, applying or forming a film around the photoresist, and then removing the photoresist. Alternatively, the frame layer 52 may be 3D printed and formed directly on the surface of the flexible substrate 51.

As described above, the detecting device 1 of the first embodiment includes the ultrasonic transducers SE that transmit and receive ultrasonic waves. The detecting device 1 includes a laminate and the frame layer 52 that is stacked on a first face of the laminate that has the first face and a second face opposite the first face. The laminate includes the flexible substrate 51, the circuit layer 53 stacked on the flexible substrate 51, and the piezoelectric layer 54 stacked on the circuit layer 53. Specifically, the frame layer 52 is bonded to the flexible substrate 51. The ultrasonic transducer SE includes the first electrode 12 that is in contact with the piezoelectric layer 54, and the second electrode 14 that is in contact with the piezoelectric layer 54. The frame layer 52 has the cavity FH at a position that overlaps the first electrode 12 in plan view.

With this configuration, the flexible substrate 51 is flexed more easily than a substrate made of glass or silicon, for example, is, in response to vibration, thus resisting fracture of the bonded surfaces of the flexible substrate 51, the circuit layer 53, and the piezoelectric layer 54. The membrane vibrator UE can be produced at low cost by simply sticking the flexible substrate 51 and the frame layer 52 having the cavity FH together.

Second Embodiment

Figure 9:
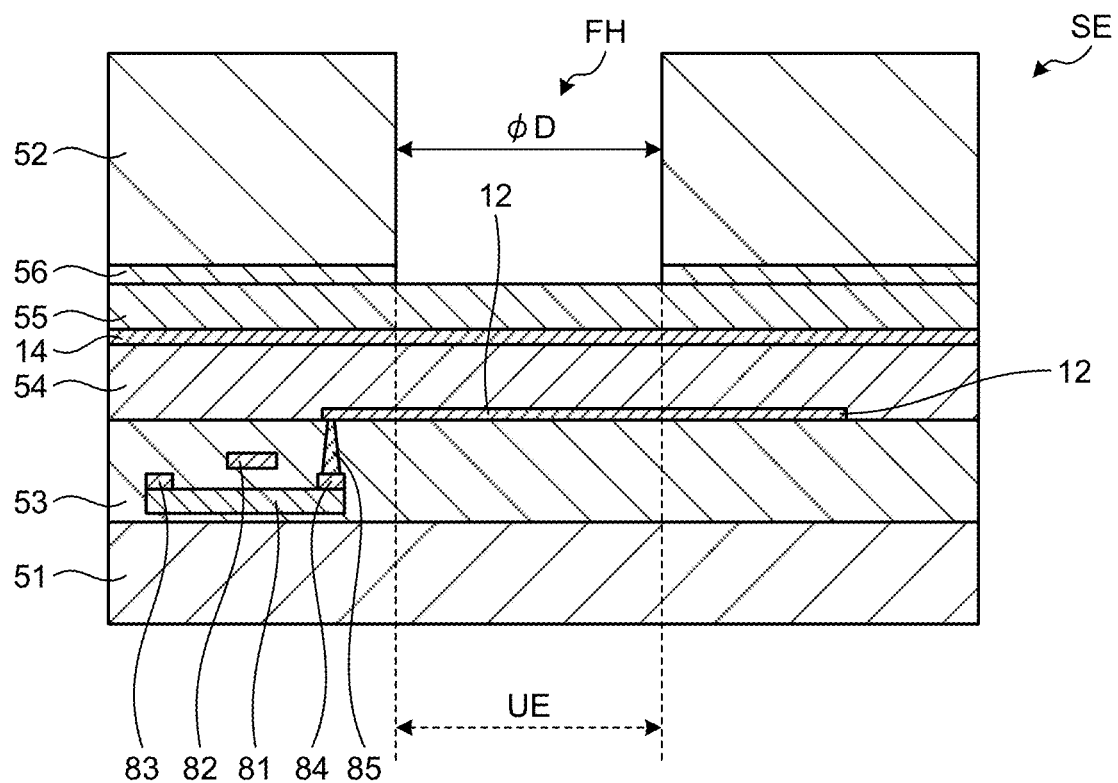
FIG. 9 is a sectional view illustrating a detection area according to a second embodiment.

FIG. 9 is a sectional view illustrating a detection area according to a second embodiment. In the second embodiment, the same reference signs are given to the same configuration as in the first embodiment, and the description thereof may be omitted. In FIG. 9, the cross section of one ultrasonic transducer SE in the detection area AA is illustrated.

Although, in the first embodiment, the frame layer 52 is bonded to one face of the flexible substrate 51, in the second embodiment, the frame layer 52 is on the opposite side of the first embodiment to the circuit layer 53 and the piezoelectric layer 54.

The frame layer 52 is bonded to one face of the protective layer 55 through the adhesive layer 56. The cavity FH is opened in the frame layer 52 for each ultrasonic transducer SE.

As described above, the detecting device 1 of the second embodiment includes the ultrasonic transducers SE that transmit and receive ultrasonic waves. The detecting device 1 includes a laminate and the frame layer 52 that is stacked on a second face of the laminate that has a first face and the second face opposite the first face. The laminate includes the flexible substrate 51, the circuit layer 53 stacked on the flexible substrate 51, and the piezoelectric layer 54 stacked on the circuit layer 53. Specifically, the frame layer 52 is bonded to the protective layer 55 on the opposite side of the laminate from the side where the flexible substrate 51 is present. The ultrasonic transducer SE includes the first electrode 12 that is in contact with the piezoelectric layer 54, and the second electrode 14 that is in contact with the piezoelectric layer 54. The frame layer 52 has the cavity FH at a position that overlaps the first electrode 12 in plan view.

With this configuration, the flexible substrate 51 is flexed more easily than a substrate made of glass or silicon, for example, is, in response to vibration, thus resisting fracture of the bonded surfaces of the flexible substrate 51, the circuit layer 53, and the piezoelectric layer 54. The membrane vibrator UE can be produced at low cost by simply sticking the flexible substrate 51 and the frame layer 52 having the cavity FH together.

Because the frame layer 52 is closer to the circuit layer 53 and the piezoelectric layer 54 than in the first embodiment, crosstalk, in which vibration of the piezoelectric layer 54 of one ultrasonic transducer SE propagates to adjacent ultrasonic transducers SE, is suppressed.

Third Embodiment

Figure 10:
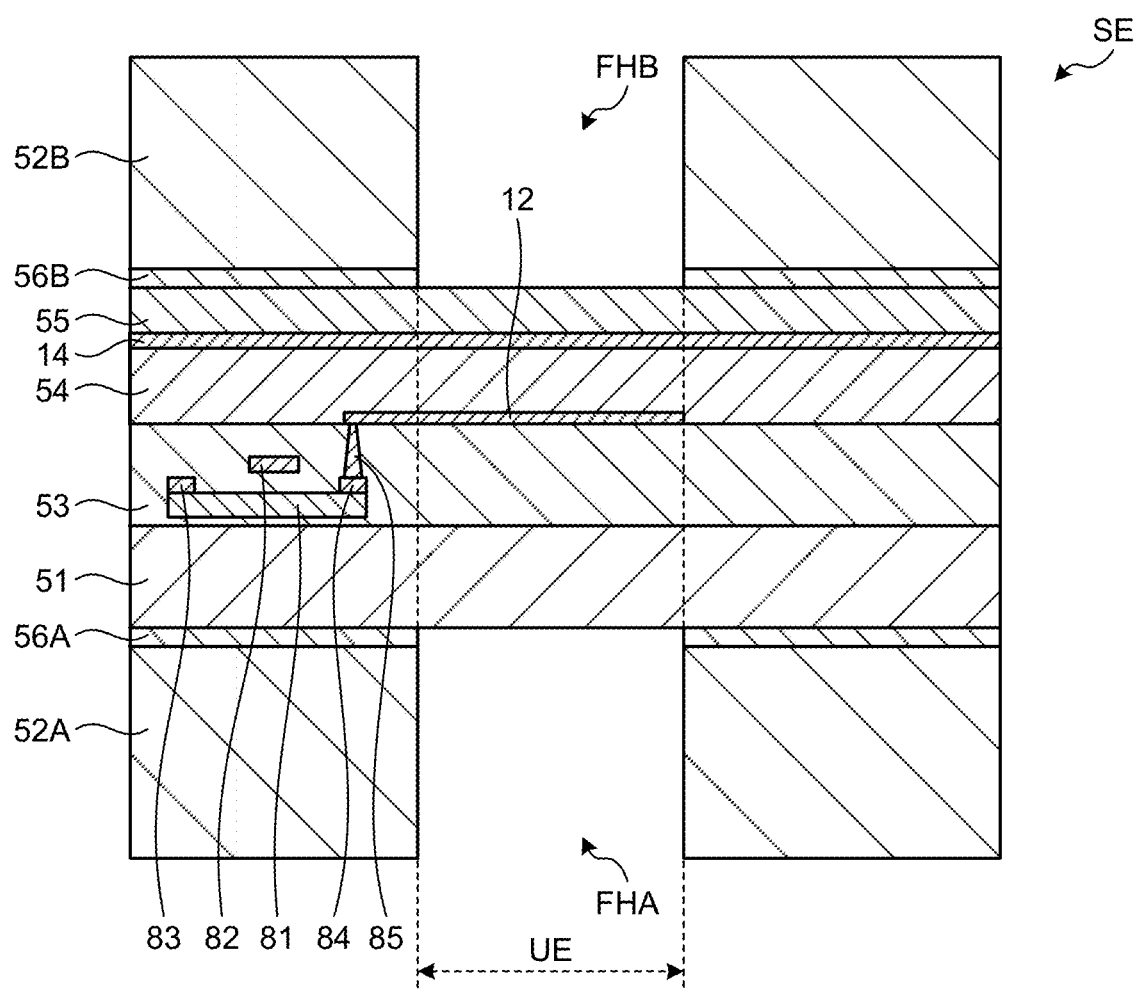
FIG. 10 is a sectional view illustrating a detection area according to a third embodiment.

FIG. 10 is a sectional view illustrating a detection area according to a third embodiment. In the third embodiment, the same reference signs are given to the same configuration as in the first and second embodiments, and the description thereof may be omitted. In FIG. 10, the cross section of one ultrasonic transducer SE in the detection area AA is illustrated.

A frame layer 52A is bonded to one face of the flexible substrate 51 through an adhesive layer 56A. A cavity FHA is opened in the frame layer 52A for each ultrasonic transducer SE.

A frame layer 52B is bonded to one face of the protective layer 55 through an adhesive layer 56B. A cavity FHB is opened in the frame layer 52B for each ultrasonic transducer SE.

As described above, the detecting device 1 of the third embodiment includes the ultrasonic transducers SE that transmit and receive ultrasonic waves. The detecting device 1 includes a laminate, the frame layer 52A that is stacked on a first face of the laminate, and the frame layer 52B that is stacked on a second face opposite the first face. The laminate includes the flexible substrate 51, the circuit layer 53 stacked on the flexible substrate 51, and the piezoelectric layer 54 stacked on the circuit layer 53. Specifically, the circuit layer 53 and the piezoelectric layer 54 are sandwiched between the frame layer 52A and the frame layer 52B. The ultrasonic transducer SE includes the first electrode 12 that is in contact with the piezoelectric layer 54, and the second electrode 14 that is in contact with the piezoelectric layer 54. The frame layer 52 has the cavity FHA and the cavity FHB at positions that overlap the first electrode 12 in plan view. The cavity FHA of the frame layer 52A and the cavity FHB of the frame layer 52B are present at positions that overlap one another in plan view.

With this configuration, the flexible substrate 51 is flexed more easily than a substrate made of glass or silicon, for example, is, in response to vibration, thus resisting fracture of the bonded surfaces of the flexible substrate 51, the circuit layer 53, and the piezoelectric layer 54. The membrane vibrator UE can be produced at low cost by simply sticking the flexible substrate 51 and the frame layer 52 having the cavity FH together.

Because the circuit layer 53 and the piezoelectric layer 54 are sandwiched between the frame layer 52A and the frame layer 52B, crosstalk, in which vibration of the piezoelectric layer 54 of one ultrasonic transducer SE propagates to adjacent ultrasonic transducers SE, is suppressed.

Fourth Embodiment

Figure 11:
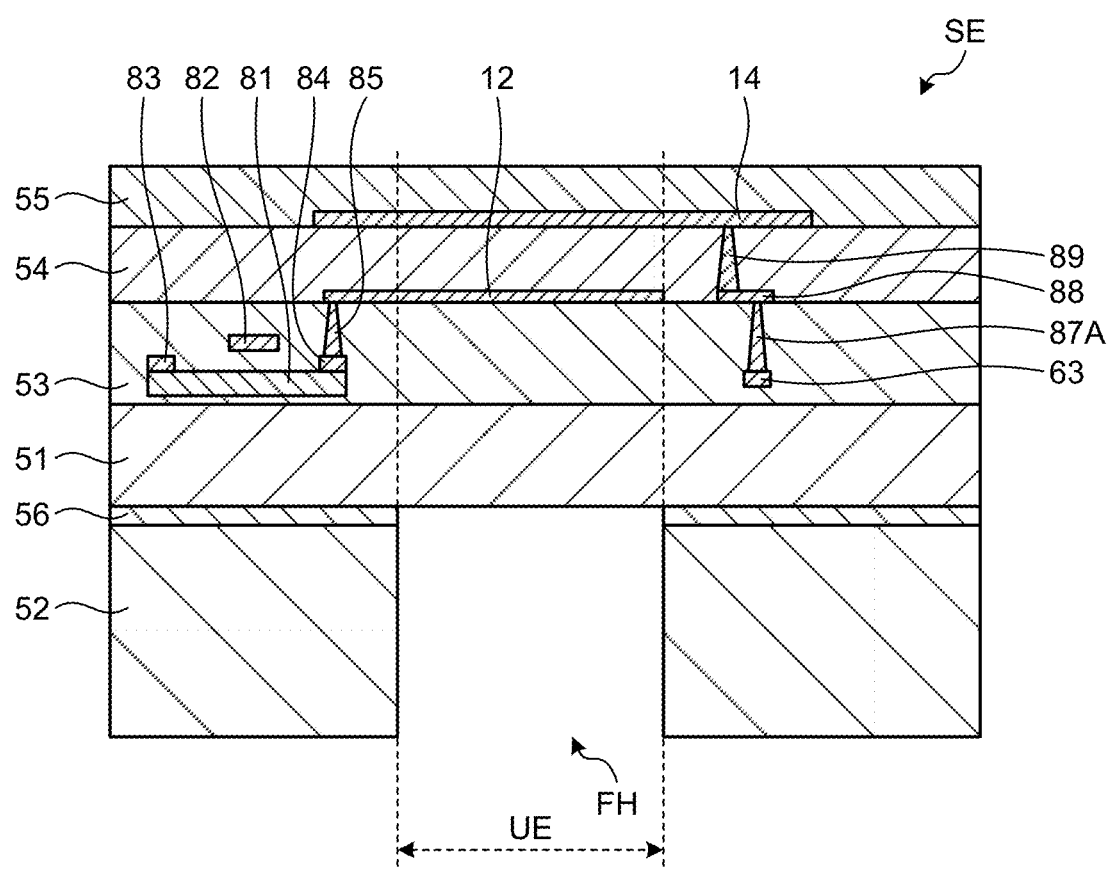
FIG. 11 is a sectional view illustrating a detection area according to a fourth embodiment.

FIG. 11 is a sectional view illustrating a detection area according to a fourth embodiment. In the fourth embodiment, the same reference signs are given to the same configuration as in the first to third embodiments, and the description thereof may be omitted. In FIG. 11, the cross section of one ultrasonic transducer SE in the detection area AA is illustrated.

As illustrated in FIG. 11, the reference potential wiring line 63 is routed to each ultrasound transducer SE. The reference potential wiring line 63 is formed in a layer different from the source electrode 83 and the drain electrode 84, and is formed in the same layer as the semiconductor layer 81, for example.

A relay wiring line 88 in the same layer as the first electrode 12 is coupled to the reference potential wiring line 63 through a through hole 87A. The second electrode 14 and the relay wiring line 88 are coupled through a through hole 89. This configuration allows the frame area GA to be narrower.

The second electrode 14 of each ultrasound transducer SE is provided in the area overlapping the cavity FH in plan view. Because adjacent second electrodes 14 are separated from each other, crosstalk is reduced between ultrasonic waves Ru detected by adjacent ultrasonic transducers SE.

Because the second electrode 14 and the reference potential wiring line 63 are electrically coupled to each other at a position that does not overlap the cavity FH in plan view, the possibility of decoupling of the reference potential wiring line 63 is reduced.

Fifth Embodiment

Figure 12:
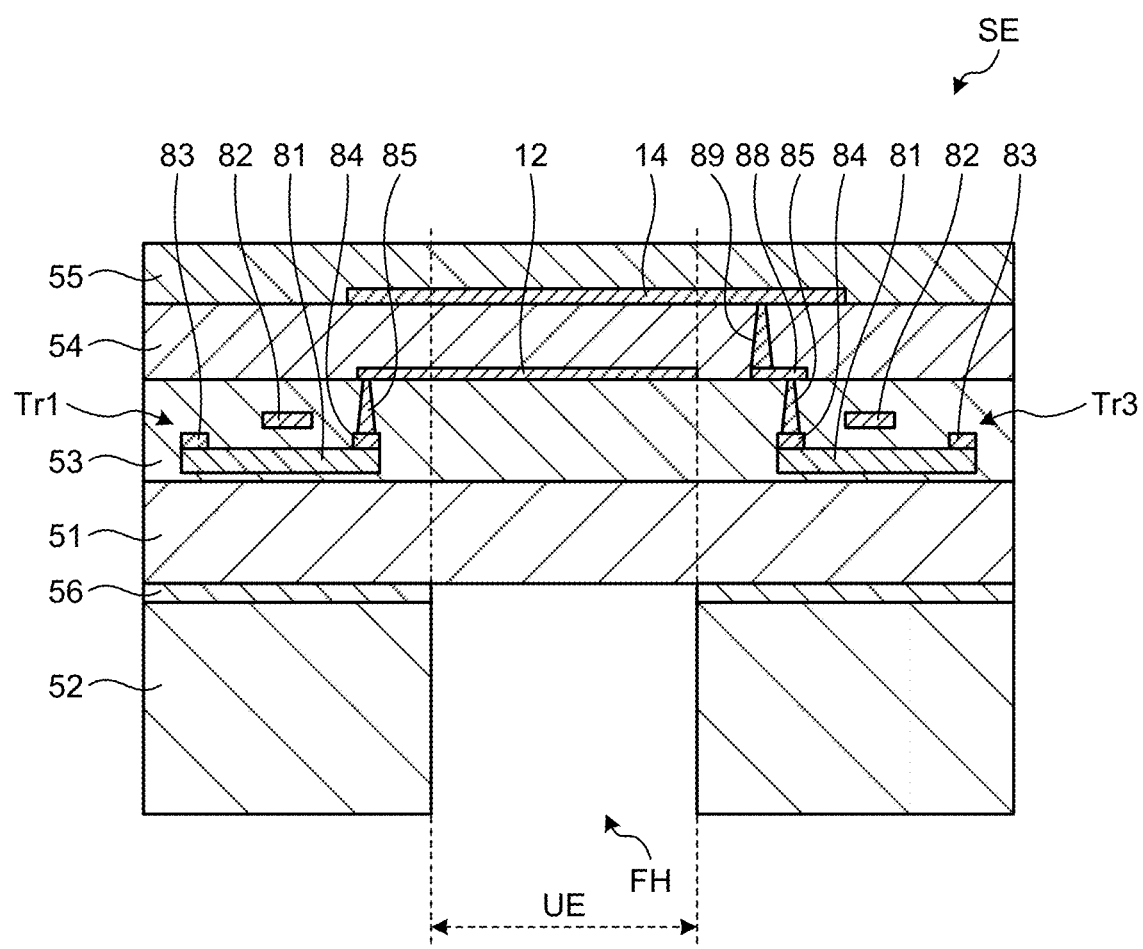
FIG. 12 is a sectional view illustrating a detection area according to a fifth embodiment.
Figure 13:
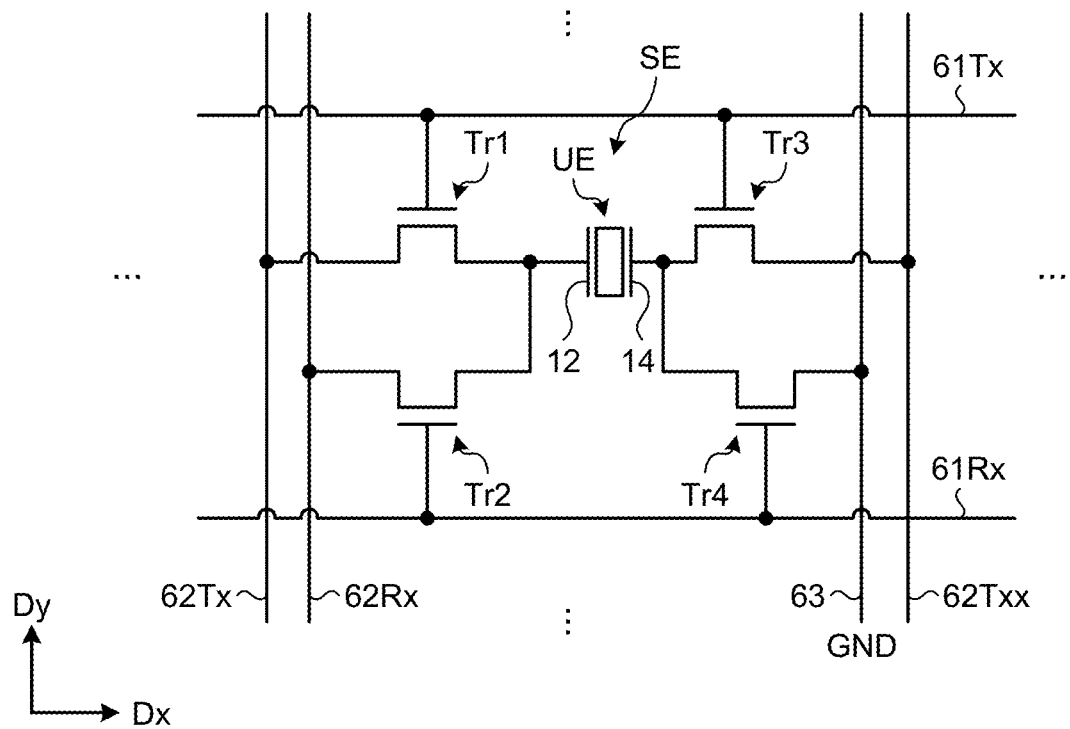
FIG. 13 is a circuit diagram illustrating one of a plurality of detection areas according to the fifth embodiment.

FIG. 12 is a sectional view illustrating a detection area according to a fifth embodiment. FIG. 13 is a circuit diagram illustrating one of a plurality of detection areas according to the fifth embodiment. In the fourth embodiment, the same reference signs are given to the same configuration as in the first to fourth embodiments, and the description thereof may be omitted. In FIG. 12, the cross section of one ultrasonic transducer SE in the detection area AA is illustrated.

As illustrated in FIG. 12, the second electrode 14 is electrically coupled to a third switching element Tr3. Because the third switching element Tr3 has the same configuration as the first switching element Tr1, a detailed description thereof is omitted. The drain electrode 84 of the third switching element Tr3 is electrically coupled to the second electrode 14 through the through hole 85, the relay wiring line 88, and the through hole 89.

The ultrasonic transducers SE each includes the first switching element Tr1, the second switching element Tr2, the third switching element Tr3, a fourth switching element Tr4, and the membrane vibrator UE. The first switching element Tr1 performs switching control of coupling between the transmission signal line 62Tx and the membrane vibrator UE. The second switching element Tr2 performs switching control of coupling between the reception signal line 62Rx and the membrane vibrator UE. The third switching element Tr3 performs switching control of coupling between a transmission signal line 62Txx and the membrane vibrator UE. The second switching element Tr2 performs switching control of coupling between the reference potential wiring line 63 and the membrane vibrator UE.

The second electrode 14 is coupled to a drain of the third switching element Tr3. The transmission signal line 62Txx is coupled to a source of the third switching element Tr3. The transmission signal line 62Txx (second transmission signal line) transmits a signal of the opposite phase of the oscillation pulse Set (n) of the transmission signal line 62Tx (first transmission signal line). The second electrode 14 is coupled to a drain of the fourth switching element Tr4. The reference potential wiring line 63 is coupled to a source of the fourth switching element Tr4.

During the transmission of ultrasonic waves, the first switching element Tr1 and the third switching element Tr3 perform on operation simultaneously, and the second switching element Tr2 and the fourth switching element Tr4 perform off operation simultaneously. The transmission signal line 62Tx transmits a signal of the oscillation pulse Set (n) to the first electrode 12 through the first switching element Tr1, and the transmission signal line 62Txx transmits the signal of the opposite phase of the oscillation pulse Set (n) to the second electrode 14 through the third switching element Tr3. As a result, the amplitude of the signal applied to the piezoelectric layer 54 is double that of the first embodiment, resulting in improved output of ultrasound waves.

During the reception of ultrasonic waves, the first switching element Tr1 and the third switching element Tr3 perform off operation simultaneously, and the second switching element Tr2 and the fourth switching element Tr4 perform on operation simultaneously. The reception signal line 62Rx and the first electrode 12 are coupled to each other through the second switching element Tr2, and the reference potential wiring line 63 and the second electrode 14 are coupled to each other through the third switching element Tr3. As a result, the detection signal Det(n) of the ultrasonic transducer SE is output to the signal detection circuit 22.

The second electrode 14 of each ultrasound transducer SE is provided in the area overlapping the cavity FH in plan view. Adjacent second electrodes 14 are separated from each other. In the ultrasonic transducer SE not selected by the scanning circuit 17, the second electrode 14 becomes the reference potential GND, and noise from the ultrasonic transducer SE not selected by the scanning circuit 17 is suppressed.

In the ultrasonic transducer SE selected by the scanning circuit 17, the signal of the opposite phase of the oscillation pulse Set (n) is transmitted to the second electrode 14, resulting in increased amplitude of the membrane vibrator UE. In the ultrasonic transducer SE not selected by the scanning circuit 17, the second electrode 14 becomes the reference potential GND, and the effect of vibration of other ultrasonic transducers SE can be suppressed.

Sixth Embodiment

Figure 14:
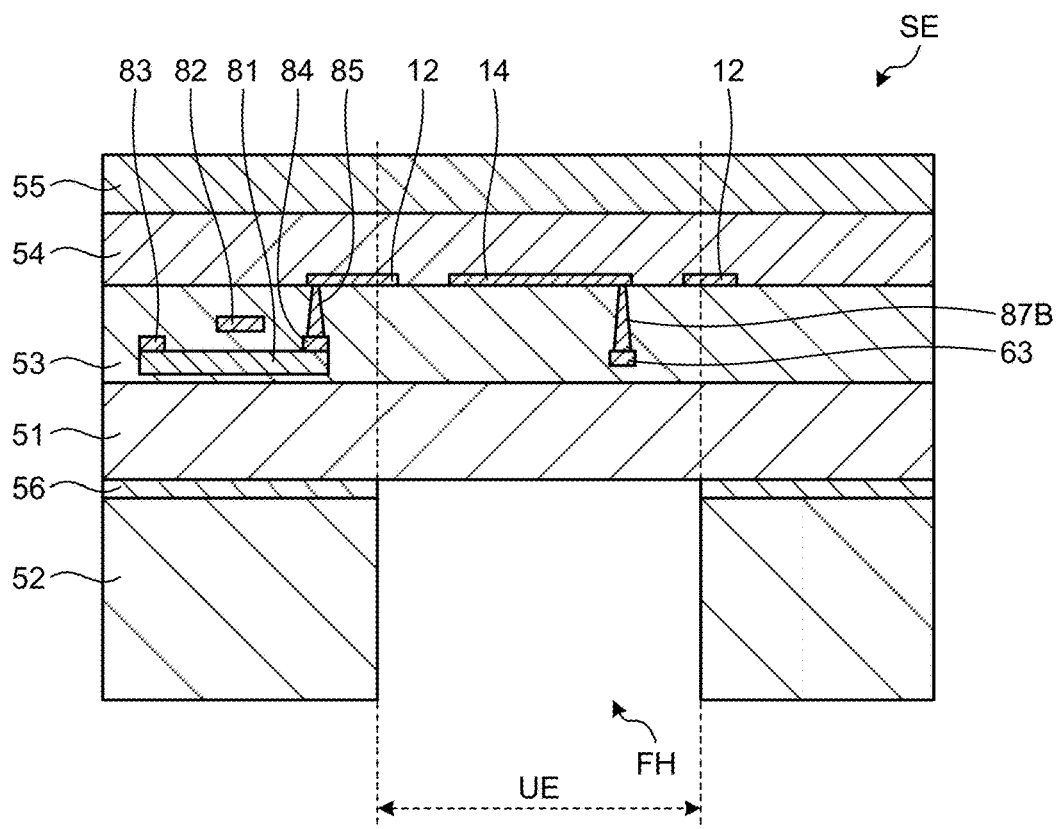
FIG. 14 is a sectional view illustrating a detection area according to a sixth embodiment.
Figure 15:
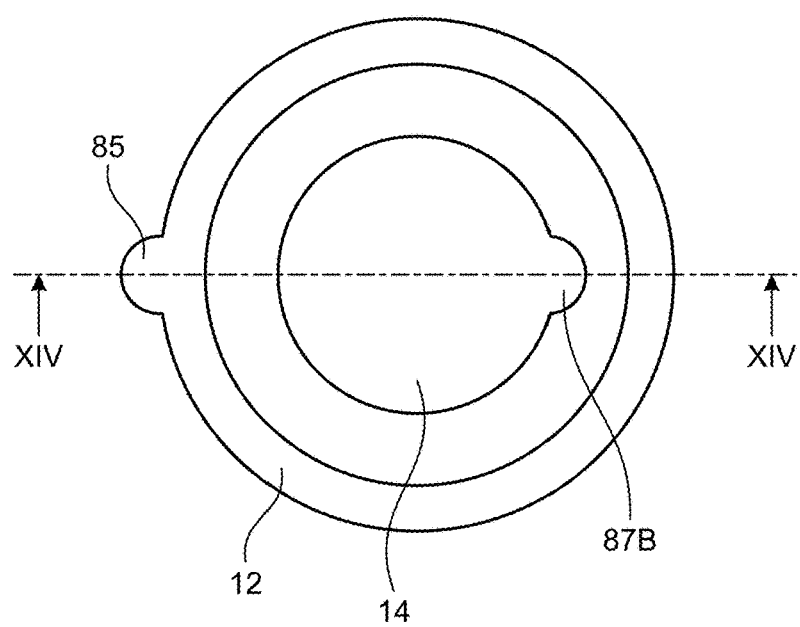
FIG. 15 is a plan view illustrating a first electrode and a second electrode according to the sixth embodiment.

FIG. 14 is a sectional view illustrating a detection area according to a sixth embodiment. FIG. 15 is a plan view illustrating the first electrode and the second electrode according to the sixth embodiment. FIG. 14 illustrates section XIV-XIV of FIG. 15. In the sixth embodiment, the same reference signs are given to the same configuration as in the first to fifth embodiments, and the description thereof may be omitted. In FIG. 14, the cross section of one ultrasonic transducer SE in the detection area AA is illustrated.

As illustrated in FIG. 14, the reference potential wiring line 63 is routed to each ultrasound transducer SE. The reference potential wiring line 63 is formed in a layer different from the source electrode 83 and the drain electrode 84, and is formed in the same layer as the semiconductor layer 81, for example.

The second electrode 14 in the same layer as the first electrode 12 is coupled to the reference potential wiring line 63 through a through hole 87B. As illustrated in FIG. 15, the second electrode 14 is in contact with a face on the same side as a face of the piezoelectric layer 54 with which the first electrode 12 is in contact. The second electrode 14 is inside the second electrode 14. This configuration allows the frame area GA to be narrower.

The second electrode 14 of each ultrasound transducer SE is provided in the area overlapping the cavity FH in plan view. Because adjacent second electrodes 14 are separated from each other, crosstalk is reduced between ultrasonic waves Ru detected by adjacent ultrasonic transducers SE.

The area where the second electrode 14 is formed has a similar figure to the area of cavity FH in plan view and smaller than the area of cavity FH. The area where the first electrode 12 is formed overlaps the boundary of the area of the cavity FH in plan view, and the first electrode 12 is annular.

Figure 16:
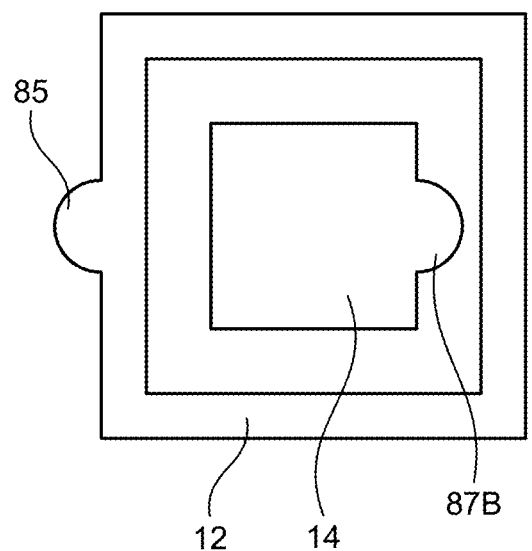
FIG. 16 is a plan view illustrating a first electrode and a second electrode according to a first modification of the sixth embodiment.

FIG. 16 is a plan view illustrating a first electrode and a second electrode according to a first modification of the sixth embodiment. As illustrated in FIG. 16, in the first modification, the second electrode 14 is rectangular and the outer diameter of the first electrode 12 is rectangular and annular. The first electrode 12 and the second electrode 14 are in the same layer as in the sixth embodiment.

Figure 17:
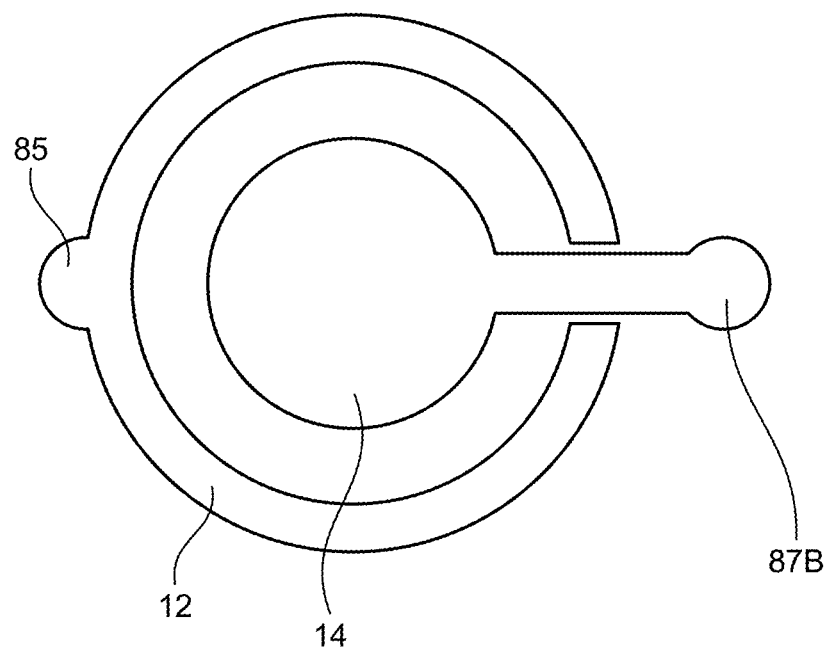
FIG. 17 is a plan view illustrating a first electrode and a second electrode according to a second modification of the sixth embodiment.

FIG. 17 is a plan view illustrating a first electrode and a second electrode according to a second modification of the sixth embodiment. As illustrated in FIG. 17, in the second modification, the area where the second electrode 14 is formed has a similar figure to the area of cavity FH in plan view and smaller than the area of cavity FH. The area where the first electrode 12 is formed overlaps the boundary of the area of the cavity FH in plan view, and the first electrode 12 is annular. The first electrode 12 and the second electrode 14 are in the same layer as in the sixth embodiment.

The through hole 87B is disposed outside of the first electrode 12, and the through hole 87B and the second electrode 14 are coupled to each other by wiring. With this configuration, the reference potential wiring line 63 no longer overlaps the area that overlaps the area of the cavity FH in plan view, so that the reference potential wiring line 63 is less affected by the vibration of the membrane vibrator UE, and the reliability of the detecting device 1 is improved.

Figure 18:
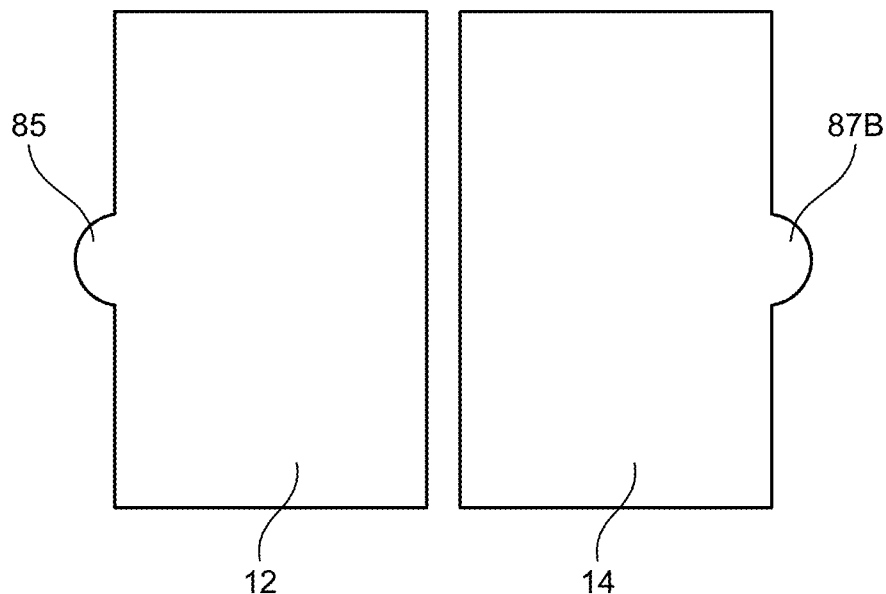
FIG. 18 is a plan view illustrating a first electrode and a second electrode according to a third modification of the sixth embodiment.

FIG. 18 is a plan view illustrating a first electrode and a second electrode according to a third modification of the sixth embodiment. As illustrated in FIG. 18, in the third modification, the first electrode 12 and the second electrode 14 are rectangular, and the first electrode 12 and the second electrode 14 are adjacent to each other. The first electrode 12 and the second electrode 14 are in the same layer as in the sixth embodiment.

The through hole 87B is disposed outside of the area that overlaps the area of the cavity FH in plan view, and the through hole 87B and the second electrode 14 are coupled to each other by wiring. With this configuration, the reference potential wiring line 63 no longer overlaps the area that overlaps the area of the cavity FH in plan view, so that the reference potential wiring line 63 is less affected by the vibration of the membrane vibrator UE, and the reliability of the detecting device 1 is improved.

Figure 19:
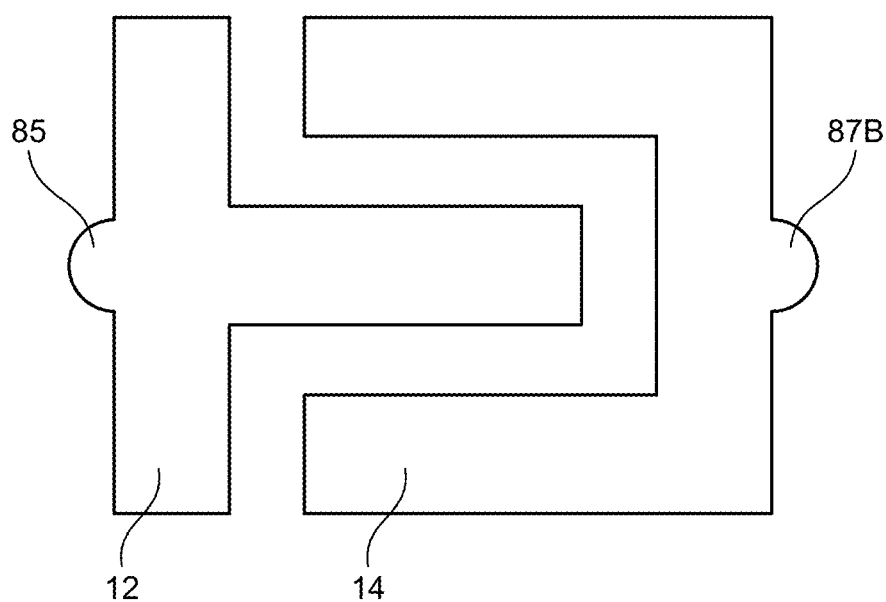
FIG. 19 is a plan view illustrating a first electrode and a second electrode according to a fourth modification of the sixth embodiment.

FIG. 19 is a plan view illustrating a first electrode and a second electrode according to a fourth modification of the sixth embodiment. As illustrated in FIG. 19, in the fourth modification, the first electrode 12 and the second electrode 14 are interdigital electrodes that interlock with each other. The first electrode 12 and the second electrode 14 are in the same layer as in the sixth embodiment.

The through hole 87B is disposed outside of the area that overlaps the area of the cavity FH in plan view, and the through hole 87B and the second electrode 14 are coupled to each other by wiring. With this configuration, the reference potential wiring line 63 no longer overlaps the area that overlaps the area of the cavity FH in plan view, so that the reference potential wiring line 63 is less affected by the vibration of the membrane vibrator UE, and the reliability of the detecting device 1 is improved.

Seventh Embodiment

Figure 20:
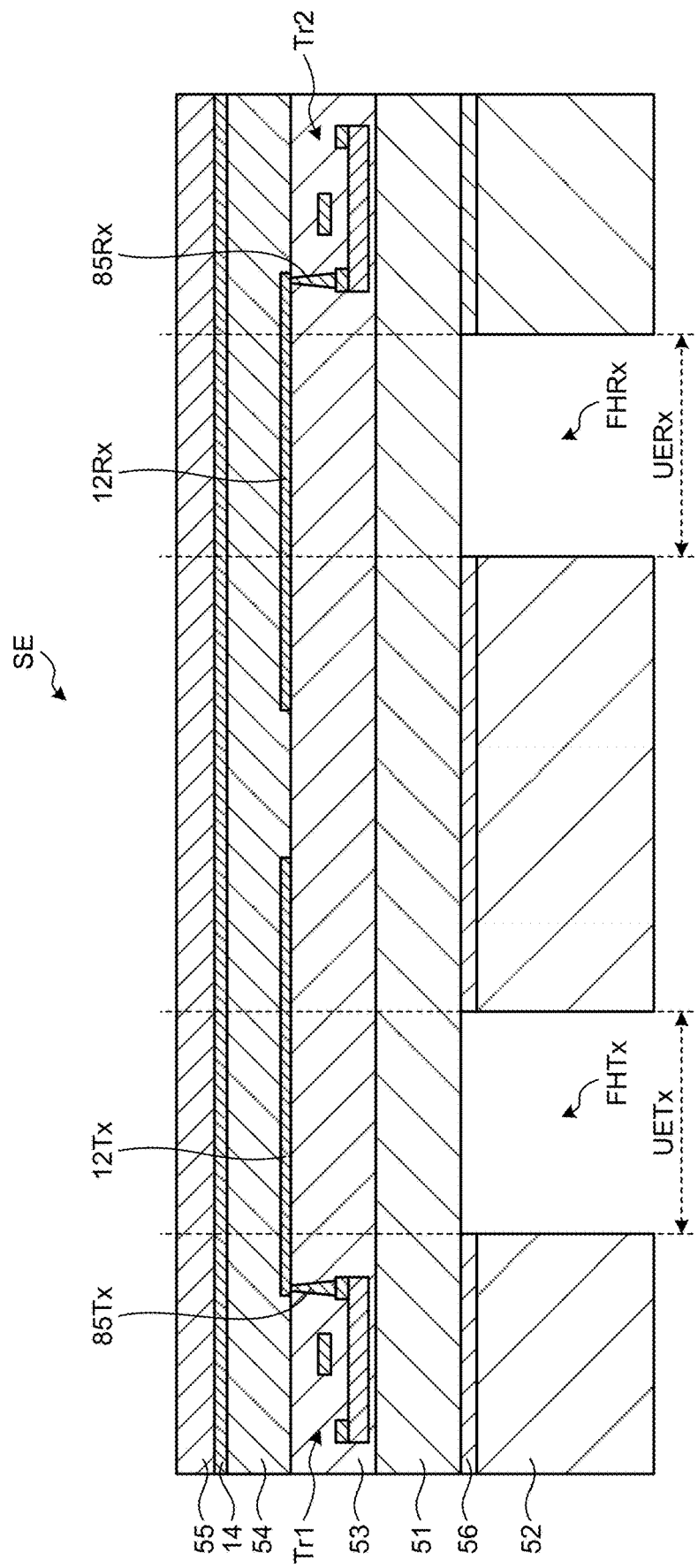
FIG. 20 is a plan view illustrating a detection area according to a seventh embodiment.
Figure 21:
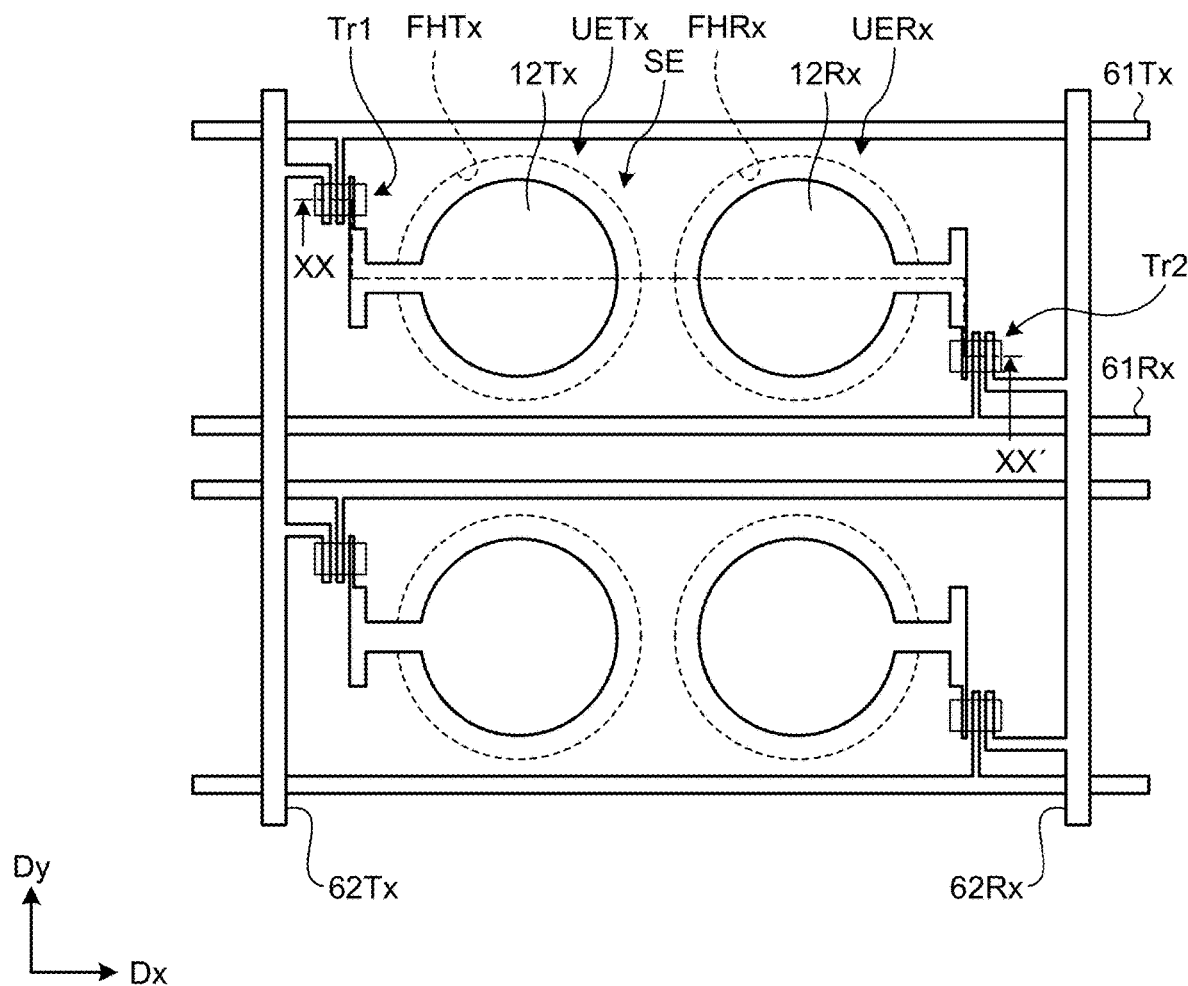
FIG. 21 is a sectional view illustrating the detection area according to the seventh embodiment.

FIG. 20 is a plan view illustrating a detection area according to a seventh embodiment. FIG. 21 is a sectional view illustrating the detection area according to the seventh embodiment. FIG. 20 illustrates section XX-XX' of FIG. 21. In the seventh embodiment, the same reference signs are given to the same configuration as in the first to sixth embodiments, and the description thereof may be omitted. In FIG. 20, the cross section of one ultrasonic transducer SE in the detection area AA is illustrated.

In the seventh embodiment, a first electrode 12Tx and a first electrode 12Rx are disposed for one ultrasonic transducer SE. The first electrode 12Tx is an electrode for transmitting ultrasonic waves that generates ultrasonic waves Tu, and the first electrode 12Rx is an electrode for receiving ultrasonic waves that receives ultrasonic waves Ru.

The ultrasonic transducers SE each includes the first switching element Tr1, the second switching element Tr2, a membrane vibrator UETx, and a membrane vibrator UERx. The first switching element Tr1 is electrically coupled to the first electrode 12Tx through a through hole 85Tx. The first switching element Tr1 performs switching control of coupling between the transmission signal line 62Tx and the membrane vibrator UETx. The second switching element Tr2 is electrically coupled to the first electrode 12Rx through a through hole 85Rx. The second switching element Tr2 performs switching control of coupling between the reception signal line 62Rx and the membrane vibrator UERx.

A first cavity FHTx and a second cavity FHRx are opened in the frame layer 52 for each ultrasonic transducer SE. The frame layer 52 has the first cavity FHTx at a position that overlaps the first electrode 12Tx, and the second cavity FHRx at a position that overlaps the first electrode 12Rx, in plan view. The area overlapping the first cavity FHTx in plan view with is the membrane vibrator UETx. The area overlapping the second cavity FHRX in plan view is the membrane vibrator UERx.

Transmission and reception of ultrasonic waves are processed in a time-division manner. In the seventh embodiment, the membrane vibrator UETx and the membrane vibrator UERx are operated separately, and thus, even if the switching time from ultrasonic wave transmission to ultrasonic wave reception is shortened, the effect on the membrane vibrator UERx from the membrane vibrator UETx is minor. As a result, the detecting device 1 has a shorter detection cycle and improved detection accuracy.

The first electrode 12Tx may be disposed in the first row of ultrasonic transducer SE, and the first electrode 12Rx may be disposed in the second row of ultrasonic transducer SE.

Although preferred embodiments of the present disclosure have been described above, the present disclosure is not limited to such embodiments. What has been disclosed in the embodiments is merely an example, and various modifications can be made without departing from the purpose of the present disclosure. For example, embodiments are described with an ultrasonic transducer for both transmission and reception, but can also be applied to an ultrasonic transducer for transmission only or reception only. Any modification made, as appropriate, to the extent not departing from the purpose of the present disclosure naturally belongs to the technical scope of the present disclosure.

What is claimed is:

1. A detecting device comprising a plurality of ultrasonic transducers that transmit and receive ultrasonic waves, the detecting device comprising:
    a laminate; and
    a frame layer stacked on at least one face of a first face of the laminate and a second face opposite the first face, wherein
    the laminate comprises:
    a flexible substrate;
    a circuit layer comprising a plurality of first electrodes and at least one second electrode, the circuit layer being stacked on the flexible substrate; and
    a piezoelectric layer stacked on the circuit layer,
    one of the ultrasonic transducers comprises:
    at least one of the first electrodes that is in contact with the piezoelectric layer; and
    at least one of the second electrodes that is in contact with the piezoelectric layer, and
    the frame layer has a cavity at a position that overlaps the first electrode in plan view.

2. The detecting device according to claim 1, wherein the second electrode is in contact with a face of the piezoelectric layer opposite a face with which the first electrode is in contact, and the piezoelectric layer is sandwiched between the first electrode and the second electrode.

3. The detecting device according to claim 2, wherein the second electrode is provided across the ultrasonic transducers.

4. The detecting device according to claim 2, wherein the second electrode is provided to each of the ultrasonic transducers.

5. The detecting device according to claim 1, wherein
    the second electrode is provided to each of the ultrasonic transducers, and
    the second electrode is in contact with a face on a same side as a face of the piezoelectric layer with which the first electrode is in contact.

6. The detecting device according to claim 5, wherein
    the second electrode is provided to each of the ultrasonic transducers,
    the first electrode is annular, and
    the second electrode is surrounded by the first electrode.

7. The detecting device according to claim 5, wherein
    the second electrode is provided to each of the ultrasonic transducers, and
    the first electrode and the second electrode are disposed so as to be adjacent to each other.

8. The detecting device according to claim 4, further comprising a reference potential wiring line that supplies a potential to the second electrode, wherein
    the reference potential wiring line is routed to the ultrasonic transducer, and
    the second electrode and the reference potential wiring line are electrically coupled to each other at a position that does not overlap the cavity in plan view.

9. The detecting device according to claim 1, wherein
    the ultrasonic transducer comprises a first switching element, and
    the first switching element and the first electrode are electrically coupled at a position that does not overlap the cavity in plan view.

10. The detecting device according to claim 1, further comprising a plurality of transmission signal lines and a plurality of reception signal lines, wherein
    the ultrasonic transducer comprises a first switching element and a second switching element, and
    the first electrode is coupled to one of the transmission signal lines through the first switching element and is coupled to one of the reception signal lines through the second switching element.

11. The detecting device according to claim 10, wherein
    the second electrode is provided to each of the ultrasonic transducers,
    the ultrasonic transducer further comprises a third switching element,
    the first electrode is coupled to a first transmission signal line of the transmission signal lines through the first switching element, and
    the second electrode is coupled, through the third switching element, to a second transmission signal line to which an oscillation pulse of an opposite phase of the first transmission signal line is transmitted.

12. The detecting device according to claim 11, further comprising a reference potential wiring line supplying a potential to the second electrode, wherein
    the ultrasonic transducer further comprises a fourth switching element, and
    the second electrode is coupled to the reference potential wiring line through the fourth switching element.

13. The detecting device according to claim 1, wherein
    one of the ultrasonic transducers comprises two of the first electrodes that are in contact with the piezoelectric layer, and
    the frame layer has a first cavity at a position that overlaps one of the first electrodes, and a second cavity at a position that overlaps the other first electrode in plan view.

14. The detecting device according to claim 13, wherein
    the one of the first electrodes is an electrode for transmitting ultrasonic waves, and
    the other first electrode is an electrode for receiving ultrasonic waves.

15. The detecting device according to claim 1, wherein the frame layer is bonded to the flexible substrate.

16. The detecting device according to claim 1, wherein the frame layer is bonded to an opposite side of the laminate from a side where the flexible substrate is present.

17. The detecting device according to claim 1, wherein
    two of the frame layers sandwich the laminate, and
    the cavity of one of the frame layers and the cavity of the other frame layer are present at positions that overlap one another in plan view.

* * * * *